United States Patent
Song et al.

(10) Patent No.: US 7,968,893 B2
(45) Date of Patent: Jun. 28, 2011

(54) SEMICONDUCTOR LIGHT EMITTING DEVICE AND METHOD OF MANUFACTURING THE SAME

(75) Inventors: Sang Yeob Song, Gyunggi-do (KR); Jin Hyun Lee, Gyunggi-do (KR); Yu Seung Kim, Gyunggi-do (KR); Kwang Ki Choi, Gyunggi-do (KR); Pun Jae Choi, Gyunggi-do (KR); Hyun Soo Kim, Gyunggi-do (KR); Sang Bum Lee, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 305 days.

(21) Appl. No.: 12/210,472

(22) Filed: Sep. 15, 2008

(65) Prior Publication Data
US 2009/0085043 A1 Apr. 2, 2009

(30) Foreign Application Priority Data
Sep. 28, 2007 (KR) .................. 10-2007-0098105

(51) Int. Cl.
*H01L 31/0256* (2006.01)
*H01L 33/00* (2006.01)
*H01L 21/00* (2006.01)
(52) U.S. Cl. .......... 257/76; 257/102; 257/E33.025; 257/E33.062; 257/E21.155; 438/46
(58) Field of Classification Search .......... 257/76, 257/102, E33.025, E33.062, E21.155, E21.156, 257/E21.157; 438/46
See application file for complete search history.

(56) References Cited

U.S. PATENT DOCUMENTS

| | | |
|---|---|---|
| 6,281,526 B1 | 8/2001 | Nitta et al. |
| 2006/0157718 A1* | 7/2006 | Seo et al. .......... 257/82 |
| 2006/0214182 A1* | 9/2006 | Udagawa .......... 257/103 |
| 2008/0185608 A1* | 8/2008 | Chitnis .......... 257/99 |

FOREIGN PATENT DOCUMENTS

| JP | 3482955 | 1/2004 |
|---|---|---|
| KR | 10-0736674 | 7/2007 |

* cited by examiner

*Primary Examiner* — Lex Malsawma
(74) *Attorney, Agent, or Firm* — McDermott Will & Emery LLP

(57) ABSTRACT

Disclosed are a semiconductor light emitting device, which can improve characteristics of the semiconductor light emitting device such as a forward voltage characteristic and a turn-on voltage characteristic, increase light emission efficiency by lowering an input voltage, and increase reliability of the semiconductor light emitting device by a low-voltage operation, and a method of manufacturing the same. The semiconductor light emitting device includes: an n-type GaN semiconductor layer; an active layer formed on a gallium face of the n-type GaN semiconductor layer; a p-type semiconductor layer formed on the active layer; and an n-type electrode formed on a nitrogen face of the n-type GaN semiconductor layer and including a lanthanum (La)-nickel (Ni) alloy.

12 Claims, 5 Drawing Sheets

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2007-0098105 filed on Sep. 28, 2007, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same, and more particularly, to a semiconductor light emitting device which can improve characteristics of the semiconductor light emitting device such as a forward voltage characteristic and a turn-on voltage characteristic, increase light emission efficiency by lowering an input voltage, and increase reliability of the semiconductor light emitting device by a low-voltage operation, and a method of manufacturing the same.

2. Description of the Related Art

In general, a semiconductor light emitting device is a device in which a semiconductor material emits light. An example of the semiconductor light emitting device includes a device such as a light emitting diode (LED) that emits light by electron-hole recombination occurring at a semiconductor junction.

The semiconductor light emitting device is being widely used for lighting, a display device and a light source. The semiconductor light emitting device can emit light of a desired wavelength even with low power and prevent generation of materials that are harmful to the environment, such as mercury. Thus, the development of the semiconductor light emitting device is being accelerated for energy saving and environmental protection.

Particularly, GaN-based LEDs have recently been developed and widely used. Also, the commercialization of mobile keypads, side viewers and camera flashes employing the GaN-based LEDs is leading to active development of general lighting using GaN-based LEDs. The GaN-based LEDs are required to act as light sources having characteristics that are demanded according to their application fields including backlight units of large-sized TVs, headlights of cars, general lamps, and even products for small-sized portable products implementing a large size, high output, high efficiency and high reliability.

When the GaN-based LEDs are manufactured, it is important to control characteristics such as contact resistance of an electrode formed on each semiconductor layer. Particularly, an n-type ohmic electrode contacting an n-type GaN-based semiconductor layer is required to implement a low forward voltage (Vf). Thus, the n-type ohmic electrode contacting the n-type GaN-based semiconductor layer needs to include a material having low contact resistance.

One of Ti, Cr, Ta, Al, Au and an alloy thereof is used for an n-type electrode to be formed on the n-type GaN semiconductor layer. However, a semiconductor light emitting device including the n-type electrode using general n-type electrode materials such as Ti, Cr, Ta, Al, Au and an alloy thereof has high contact resistance, which undesirably increases a forward voltage higher than a desired level.

Therefore, there is a need to develop an n-type electrode material that can increase light-emission efficiency and maintain reliability of a product by controlling a characteristic of a semiconductor light emitting device to a desired level.

SUMMARY OF THE INVENTION

An aspect of the present invention provides a semiconductor light emitting device which can improve characteristics of the semiconductor light emitting device such as a forward voltage characteristic and a turn-on voltage characteristic, increase light emission efficiency by lowering an input voltage, and increase reliability of the semiconductor light emitting device by a low-voltage operation, and a method of manufacturing the same.

According to an aspect of the present invention, there is provided a semiconductor light emitting device including: an n-type GaN semiconductor layer; an active layer formed on a gallium face of the n-type GaN semiconductor layer; a p-type semiconductor layer formed on the active layer; and an n-type electrode formed on a nitrogen face of the n-type GaN semiconductor layer and including a lanthanum (La)-nickel (Ni) alloy.

The La—Ni alloy may be $LaNi_5$.

According to another aspect of the present invention, there is provided a method of manufacturing a semiconductor light emitting device including: forming an n-type GaN semiconductor layer on a substrate; forming an active layer on a gallium face of the n-type GaN semiconductor layer; forming a p-type semiconductor layer on the active layer; removing the substrate; and forming an n-type electrode on a nitrogen face of the n-type GaN semiconductor layer, the n-type electrode including a lanthanum (La)-nickel (Ni) alloy.

The La—Ni alloy may be $LaNi_5$. The substrate may be a sapphire substrate.

A laser treatment may be further performed on the nitrogen face of the n-type GaN semiconductor layer before the forming of the n-type electrode.

According to still another aspect of the present invention, there is provided a semiconductor light emitting device including: a GaN substrate; an n-type semiconductor layer formed on a gallium face of the GaN substrate; an active layer formed on the n-type semiconductor layer; a p-type semiconductor layer formed on the active layer; and an n-type electrode formed on a nitrogen face of the GaN substrate and including a lanthanum (La)-nickel (Ni) alloy. The GaN substrate may be a growth substrate or a support substrate.

The La—Ni alloy may be $LaNi_5$.

According to yet another aspect of the present invention, there is provided a method of manufacturing a semiconductor light emitting device including: forming an n-type semiconductor layer on a gallium face of a GaN substrate; forming an active layer on the n-type semiconductor layer; forming a p-type semiconductor layer on the active layer; and forming an n-type electrode on a nitrogen face of the GaN substrate, the n-type electrode including a lanthanum (La)-nickel (Ni) alloy.

The La—Ni alloy may be $LaNi_5$.

A laser treatment may be performed on the nitrogen face of the GaN substrate before the forming of the n-type electrode, thereby improving a characteristic of the nitrogen face.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
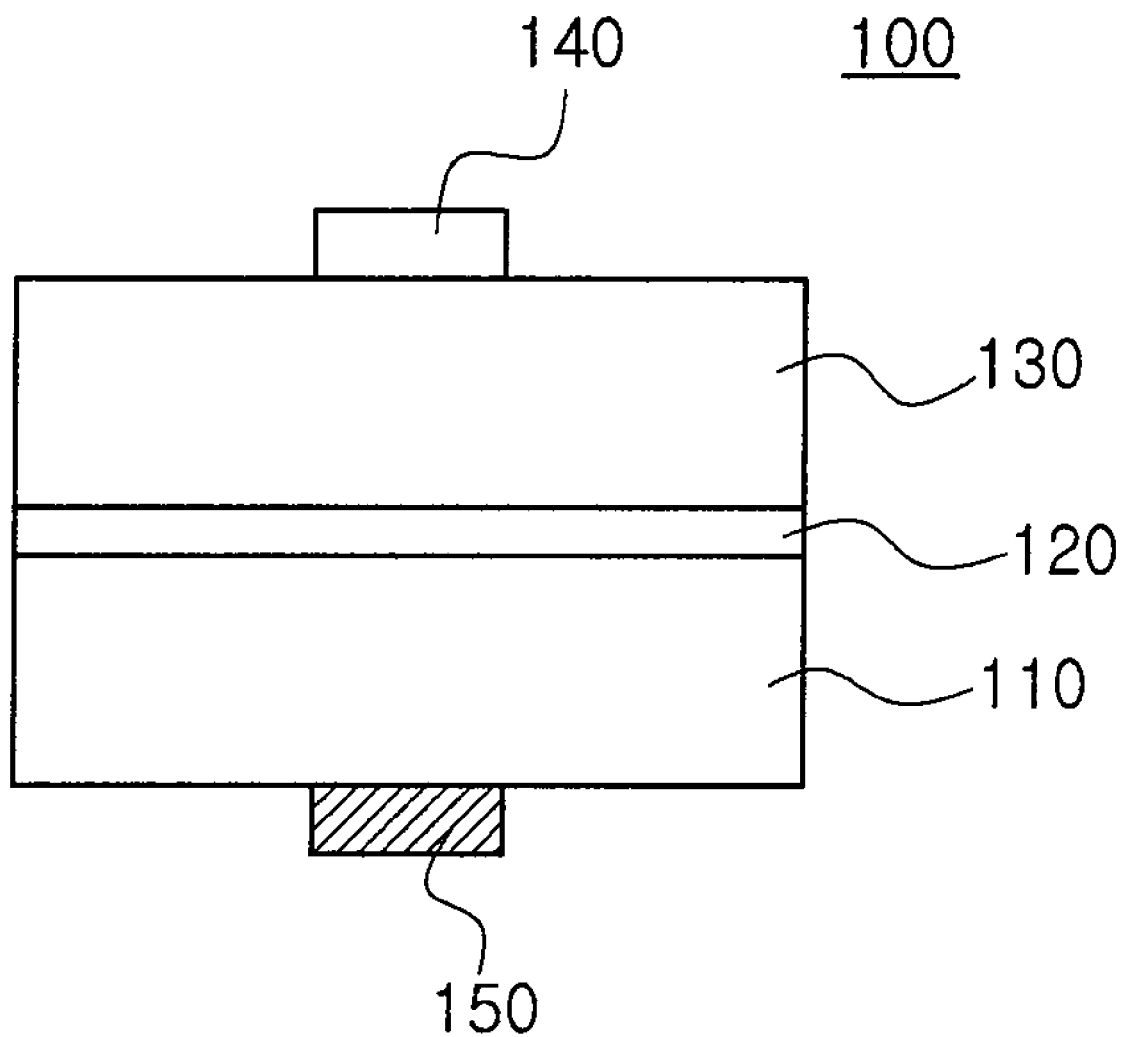
FIG. 1 is a cross-sectional view of a semiconductor light emitting device according to an embodiment of the present invention.

FIG. 1 is a cross-sectional view of a semiconductor light emitting device 100 according to an embodiment of the present invention. Referring to FIG. 1, the semiconductor light emitting device 100 includes an n-type GaN semiconductor layer 110, an active layer 120 formed on a gallium face of the n-type GaN semiconductor layer 110, a p-type semiconductor layer 130 formed on the active layer 120, and an n-type electrode 150 formed on a nitrogen face of the n-type GaN semiconductor layer 110 and including a lanthanum (La)-nickel (Ni) alloy.

The semiconductor light emitting device 100 has a structure in which the n-type GaN semiconductor layer 110, the active layer 120 and the p-type semiconductor layer 130 are sequentially stacked. The n-type GaN semiconductor layer 110 includes a GaN-based compound semiconductor. As impurities of the n-type GaN semiconductor layer 110, one of, for example, Si, Ge and Sn may be used.

The active layer 120 is formed on the gallium face of the n-type GaN semiconductor layer 110. The active layer 120 activates light emission, and is formed by using a material that has a smaller energy band gap than respective energy band gaps of the n-type GaN semiconductor layer 110 and the p-type semiconductor layer 130.

Because the n-type GaN semiconductor layer 110 includes the GaN-based compound semiconductor, the active layer 120 may be formed by using, for example, an InGaN-based compound semiconductor having a smaller energy band gap than an energy band gap of the GaN-based compound semiconductor. Because of a characteristic of the active layer 120, impurities may not be doped in the active layer 120, and a wavelength or quantum efficiency may be controlled by adjusting a height of a barrier, a thickness and a composition of a well layer or the number of wells.

A p-type semiconductor layer 130 is stacked on the active layer 120. The p-type semiconductor layer 130 may include a semiconductor such as a GaN-based semiconductor, a ZnO semiconductor, a GaAs-based semiconductor, a GaP-based semiconductor or a GaAsP-based semiconductor. Besides, the p-type semiconductor layer 130 may be implemented by being properly selected from the group consisting of the group III-V and II-VI semiconductors and Si.

If the p-type semiconductor layer 130 includes the GaN-based compound semiconductor, any one of Mg, Zn and Be may be selected and used as impurities.

The n-type electrode 150 is formed on the nitrogen face of the n-type GaN semiconductor layer 110. The nitrogen face of the n-type GaN semiconductor layer 110 means a surface where nitrogen is relatively enriched (hereinafter, also referred to as a nitrogen-enriched surface). In contrast, the gallium face means a surface where gallium is relatively enriched (hereinafter, also referred to as a gallium-enriched surface). The nitrogen face and the gallium face of the n-type GaN-based semiconductor layer 110 will be described later in further detail with reference to FIGS. 2A through 2D.

Thus, in the semiconductor light emitting device 100 according to the current embodiment, the n-type electrode 150 is formed on a nitrogen-enriched surface among surfaces of the n-type GaN semiconductor layer 110. However, when an n-type electrode is formed on the nitrogen face of the n-type GaN semiconductor layer 110, ohmic-contact formation may be degraded because of a piezoelectric effect. To achieve stable ohmic contact formation on the nitrogen face, the n-type electrode 150 includes a lanthanum (La)-nickel (Ni) alloy. Particularly, the n-type electrode 150 may include LaNi$_5$ of the La—Ni alloy.

La of the La—Ni alloy in the n-type electrode 150 may contribute to achieving stable ohmic contact because of its work function value similar to that of nitrogen. Also, since La is included in the form of an alloy with Ni, nitrogen polarity of the nitrogen face of the n-type GaN semiconductor layer 110 can be lowered, thereby further improving the ohmic contact characteristic between the n-type GaN semiconductor layer 110 and the n-type electrode 150.

A metal such as Ag, Zn or Mg may be used for a p-type electrode 140 in due consideration of an ohmic contact characteristic with the p-type semiconductor layer 130.

Figure 2A:
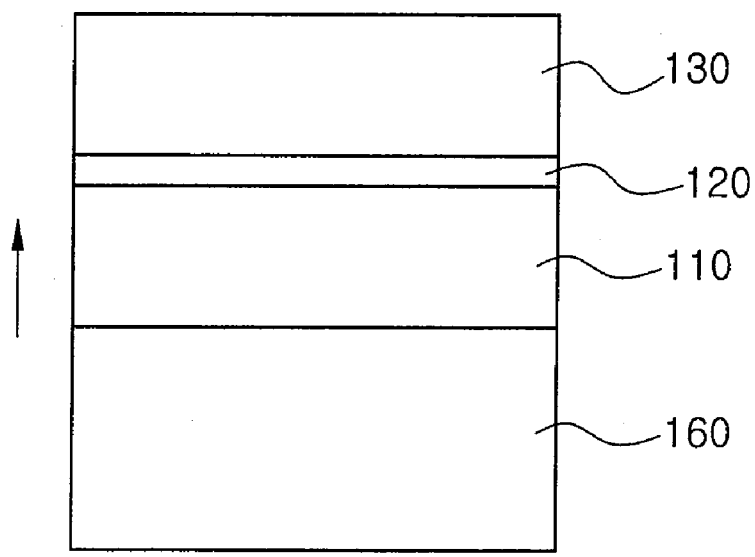
FIGS. 2A through 2D are cross-sectional views for explaining a method of manufacturing a semiconductor light emitting device according to an embodiment of the present invention.

FIGS. 2A through 2D are cross-sectional views for explaining a method of manufacturing a semiconductor light emitting device according to an embodiment of the present invention. The method of manufacturing the semiconductor light emitting device according to the current embodiment of the present invention will now be described with reference to FIGS. 2A through 2D. Referring to FIG. 2A, an n-type GaN semiconductor layer 110 is formed on a substrate 160.

The substrate 160 is a growth substrate that grows the n-type GaN semiconductor layer 110 thereon. A sapphire substrate or a spinel (MgAl$_2$O$_4$) substrate having an excellent growth property because of its lattice constant similar to that of a GaN-based semiconductor layer may be used as the substrate 160.

A nitrogen face of the n-type GaN semiconductor layer 110 grown on the substrate 160 contacts the substrate 160. An arrow indicated by a solid line in FIG. 2A represents a growth direction of the n-type GaN semiconductor layer 110. The growth direction may vary according to a growth method. Even if the same growth method is used, the growth direction may also vary according to condition control. In the current embodiment, the n-type GaN semiconductor layer 110 is grown such that its boundary surface with the substrate 160 becomes a nitrogen face, and its boundary surface with an active layer 120 becomes a gallium face. However, the present invention is not limited thereto.

When the n-type GaN semiconductor layer 110 is completely grown, the active layer 120 is formed on the gallium face of the n-type GaN semiconductor layer 110. A p-type semiconductor layer 130 is formed on the active layer 120. The n-type GaN semiconductor layer 110, the active layer 120 and the p-type semiconductor layer 130 may be formed by a well-known method. For example, a molecular beam epitaxy (MBE) method may be used.

Figure 2B:
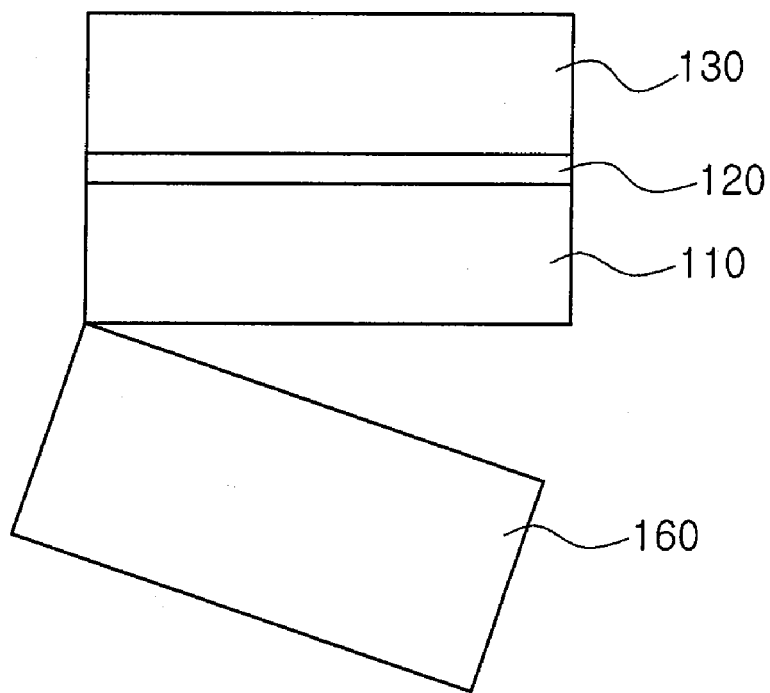
Figure 2C:
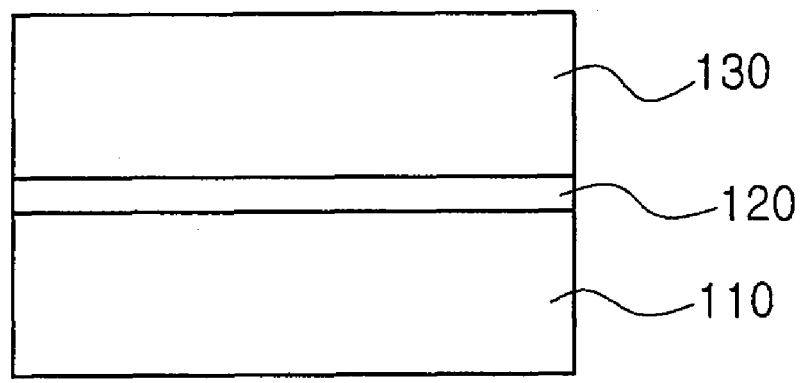

Referring to FIG. 2B, when the semiconductor layers 110 and 130 and the active layer 120 are stacked, the substrate 160 used as the growth substrate is removed by a well-known method, e.g., by using laser. Referring to FIG. 2C, an exposed surface of the n-type GaN semiconductor layer 110 after the removal of the substrate 160 is a nitrogen face, i.e., a nitrogen-enriched surface because the boundary of the n-type GaN semiconductor layer 110 with the substrate 160 is the nitrogen face.

Figure 2D:
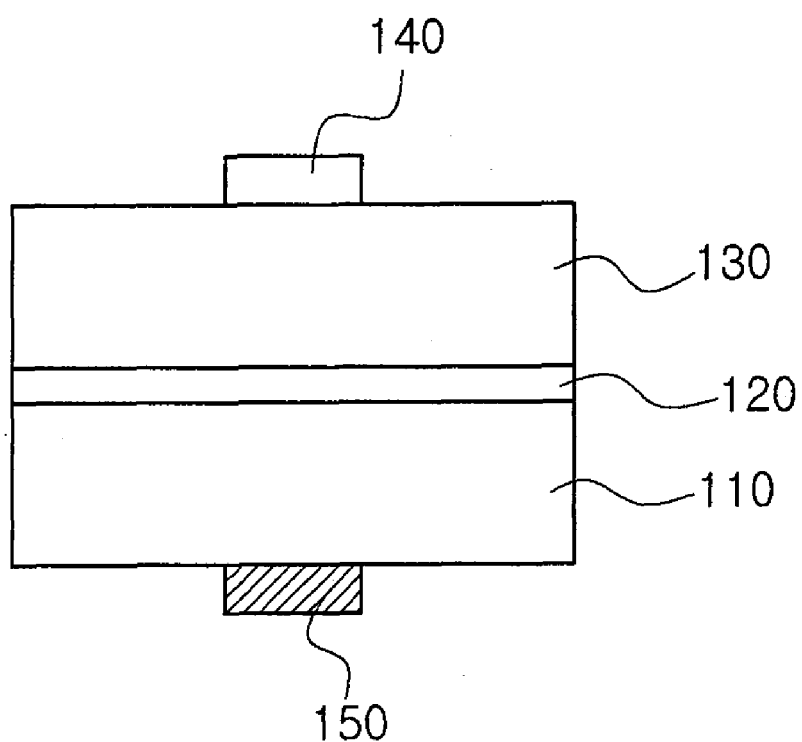

Referring to FIG. 2D, an n-type electrode 150 is formed on the nitrogen face of the n-type GaN semiconductor layer 110 exposed by the removal of the substrate 160, and a p-type electrode 140 is formed on the p-type semiconductor layer 130. The n-type electrode 150 and the p-type electrode 140 may be formed by a general electrode formation method. For example, the n-type electrode 150 and the p-type electrode 140 may be formed by using an electron beam (e-beam) evaporator.

The n-type electrode 150 includes a La—Ni alloy. Particularly, the n-type electrode 150 may include $LaNi_5$.

In a state illustrated in FIG. 2C before the formation of the n-type electrode 150, a laser treatment may be performed on the nitrogen face to improve a characteristic of the nitrogen face of the n-type GaN semiconductor layer 110. A contact characteristic with the n-type electrode 150 may be further improved because of the laser treatment.

Figure 3:
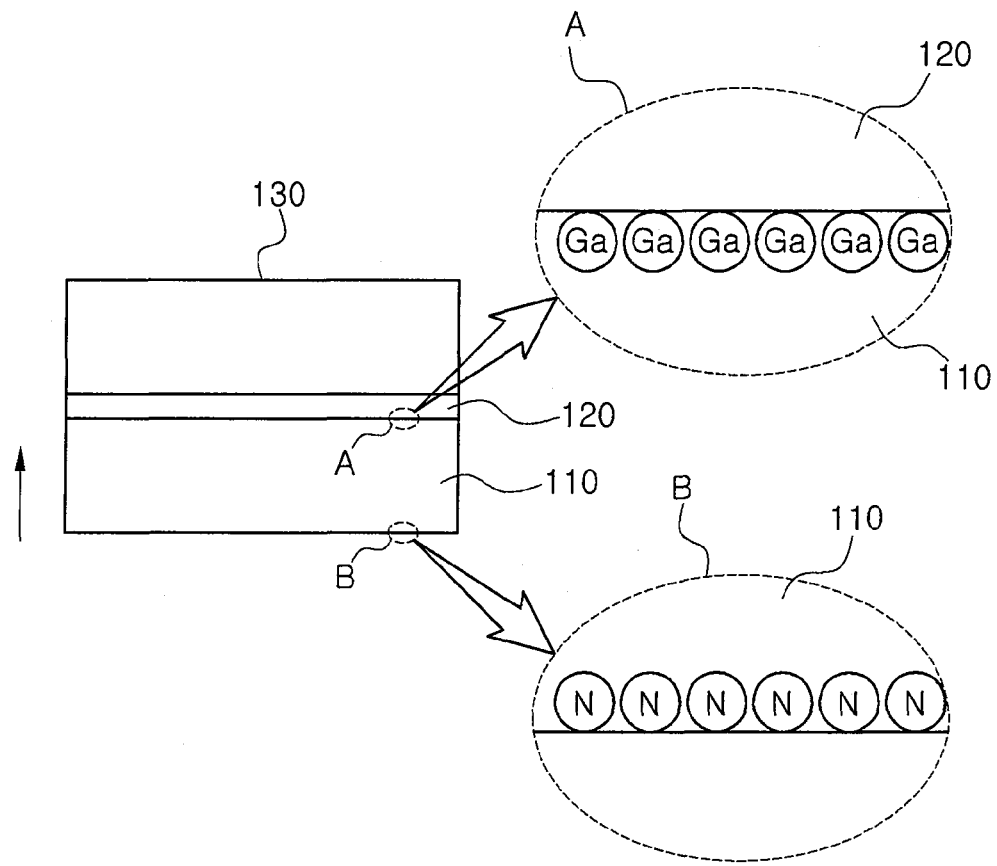
FIG. 3 illustrates a nitrogen face and a gallium face of an n-type GaN-semiconductor layer illustrated in FIG. 2C.

FIG. 3 illustrates a nitrogen face and a gallium face of the n-type GaN semiconductor layer illustrated in FIG. 2C. Portion A of FIG. 3 shows an expanded view of a boundary between the n-type GaN semiconductor layer 110 and the active layer 120, and portion B of FIG. 3 shows an expanded view of a surface of the n-type GaN semiconductor layer 110 exposed to the outside by the removal of the substrate 160, which was a boundary between the n-type GaN semiconductor layer 110 and the substrate 160. As described above, an arrow indicated by a solid line in FIG. 3 represents a growth direction of the n-type GaN semiconductor layer 110.

As shown in the portion A of FIG. 3, Ga is enriched at the boundary of the n-type GaN semiconductor layer 110 with the active layer 120. As shown in the portion B of FIG. 3, N is enriched at the surface of the n-type GaN semiconductor layer 110 exposed to the outside. In general, the n-type GaN semiconductor layer 110 on a substrate (not shown) is grown such that N is enriched at a side close to the substrate and Ga is enriched at the opposite side. In contrast, in order to grow the n-type GaN semiconductor layer 110 such that Ga is enriched at a side close to the substrate, a separate process and condition to change or control a general layer growth method is required. Therefore, in the embodiment of the present invention, the n-type GaN semiconductor layer 110 is grown as shown in FIG. 3.

The n-type electrode 150 including the La—Ni alloy is formed at the nitrogen face of the n-type GaN semiconductor layer as illustrated in FIG. 2D, and thus an excellent ohmic contact characteristic may be achieved even at the nitrogen-enriched surface.

Figure 4:
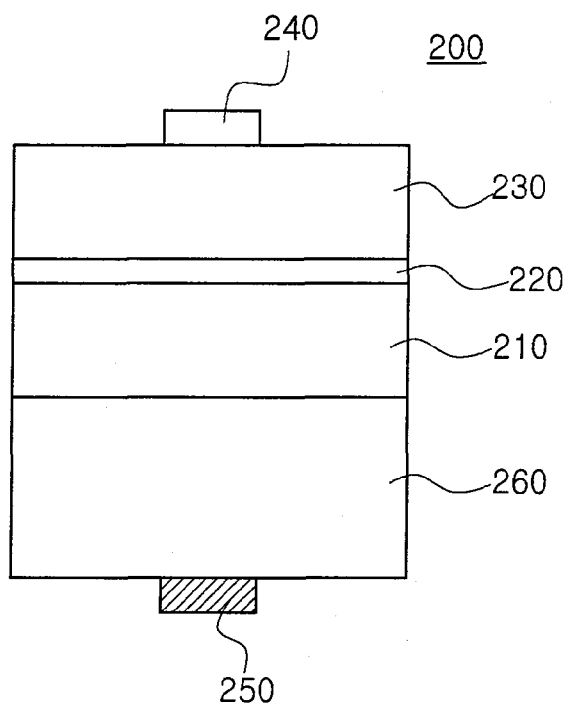
FIG. 4 is a cross-sectional view of a semiconductor light emitting device according to another embodiment of the present invention.

FIG. 4 is a cross-sectional view of a semiconductor light emitting device 200 according to another embodiment of the present invention. The semiconductor light emitting device 200 includes a GaN substrate 260, an n-type semiconductor layer 210 formed on a gallium face of the GaN substrate 260, an active layer 220 formed on the n-type semiconductor layer 210, a p-type semiconductor layer 230 formed on the active layer 220, and an n-type electrode 250 formed on a nitrogen face of the GaN substrate 250 and including a La—Ni alloy. The active layer 220 and the p-type semiconductor layer 230 are the same as the active layer 120 and the p-type semiconductor layer 230 of the semiconductor light emitting device 100 of FIG. 1, and thus description thereof is omitted.

The semiconductor light emitting device 200 according to the current embodiment has a structure in which the n-type semiconductor layer 210, the active layer 220 and the p-type semiconductor layer 230 are sequentially stacked on the GaN substrate 260. The GaN substrate 260 is a conductive substrate, and is formed of a GaN-based semiconductor used for the semiconductor layers 210 and 230.

The GaN substrate 260 may be a growth substrate or a support substrate. In the case where the GaN substrate 260 serves as the growth substrate, defect occurrence can be prevented at the time of growth because a lattice constant of the GaN substrate 260 is similar to lattice constants of a GaN-based semiconductor layer including the GaN-based semiconductor.

In the case where the GaN substrate 260 serves as the support substrate, the n-type semiconductor layer 210, the active layer 220 and the p-type semiconductor layer 230 are formed by using a separate growth substrate, and then, the growth substrate is removed. Thereafter, the GaN substrate 260 is formed to support a stacked structure of the n-type semiconductor layer 210, the active layer 220 and the p-type semiconductor layer 230. The support substrate may be formed by a well-known method, for example, a bonding method using a bonding layer or a plating method on the n-type semiconductor layer 210.

According to the current embodiment, the n-type semiconductor layer 210 may include a semiconductor such as a GaN-based semiconductor, a ZnO-based semiconductor, a GaAs-based semiconductor, a GaP-based semiconductor or a GaAsP-based semiconductor. Besides, the n-type semiconductor layer 210 may include one selected from the group consisting of the group III-V and II-VI semiconductors and Si. Since the GaN substrate 260 includes a GaN-based semiconductor, the n-type semiconductor layer 210 may be formed of the GaN-based semiconductor in due consideration of a growth condition such as a lattice constant.

According to the current embodiment, the n-type electrode 250 is formed on the nitrogen face of the GaN substrate 260. Thus, the n-type semiconductor layer 210 is formed on a gallium face of the GaN substrate 260. The n-type electrode includes a La—Ni allow, particularly, $LaNi_5$.

Before the formation of the n-type electrode 250, a laser treatment may be performed on the nitrogen face of the GaN substrate 260, thereby improving a characteristic of the nitrogen face. Because of the laser treatment, a contact characteristic of the nitrogen face of the GaN substrate 260 with the n-type electrode 250 may be further improved.

Figure 5:
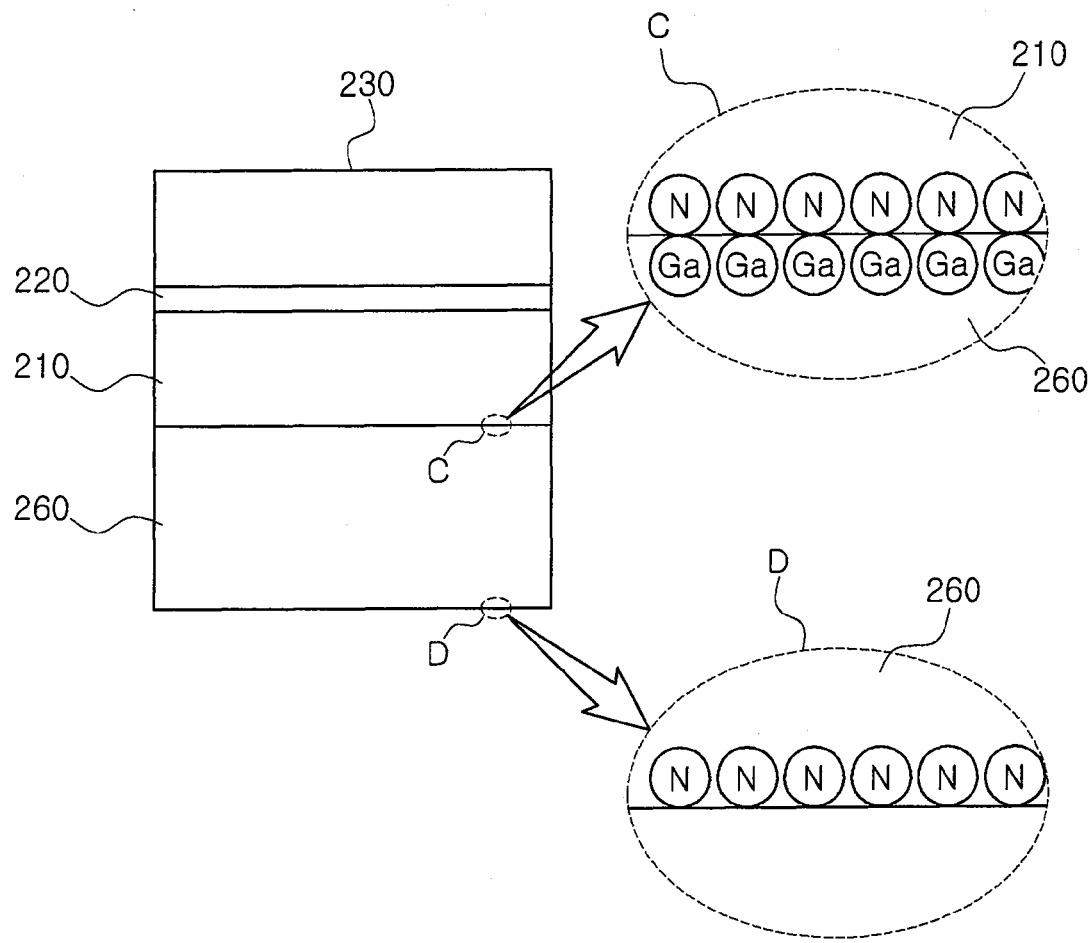
FIG. 5 illustrates a nitrogen face and a gallium face of a GaN substrate illustrated in FIG. 4.

FIG. 5 illustrates a nitrogen face and a gallium face of the GaN substrate 260 of FIG. 4. In FIG. 5, an n-type semiconductor layer 210 includes a GaN-based semiconductor, but the present invention is not limited thereto. Portion C of FIG. 5 shows an expanded view of a boundary between the GaN substrate 260 and the n-type semiconductor layer 210, and portion D of FIG. 4 shows an expanded view of an exposed surface of the GaN substrate 260.

The nitrogen face and the gallium face of the GaN substrate 260 may be selectively formed on the n-type semiconductor layer 210. In the current embodiment, the n-type semiconductor layer 210 is formed to contact the gallium face of the GaN substrate 260. Thus, the exposed surface of the GaN substrate 260 is the nitrogen face, and the n-type electrode 250 is formed on the nitrogen face (see portion D of FIG. 4). When the n-type semiconductor layer 210 is formed on the gallium face of the GaN substrate 260, the nitrogen face of the n-type semiconductor layer 210 contacts the GaN substrate 260 because of a growth characteristic.

Thus, as illustrated in FIG. 4, the n-type electrode 250 including the La—Ni alloy is formed on the nitrogen face of the GaN substrate 260, and an excellent ohmic contact characteristic can be achieved even at a nitrogen-enriched surface.

Figure 6:
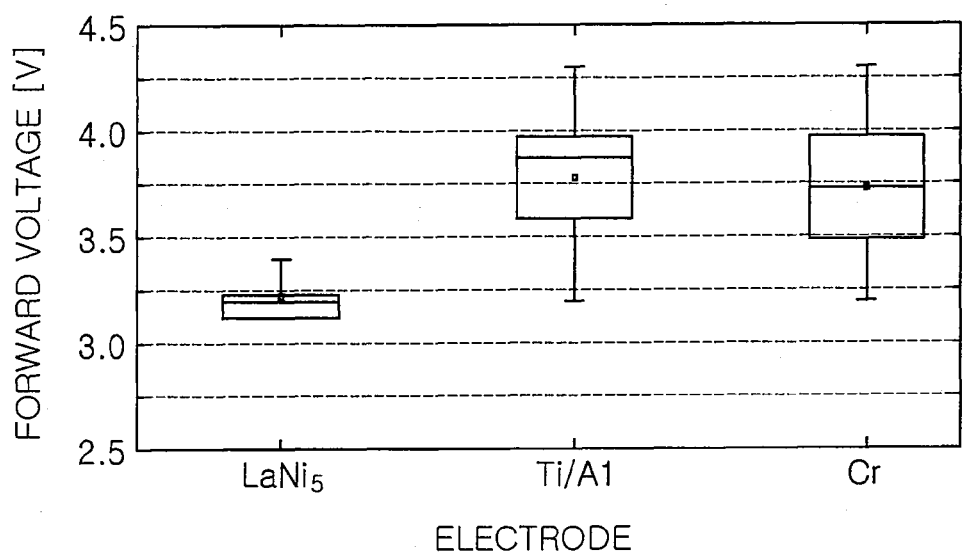
FIG. 6 is a graph showing respective forward voltages of an n-type electrode of a semiconductor light emitting device according to the present invention, a Ti/Al n-type electrode and a Cr n-type electrode.

FIG. 6 is a graph showing respective forward voltages of an n-type electrode of the semiconductor light emitting device according to the present invention, a Ti/Al n-type electrode and a Cr n-type electrode under the condition of 350 mA. In the measurement of the forward-voltage, the n-type electrode was formed on an n-type GaN semiconductor layer, and the Ti/Al and Cr n-type electrodes were also formed on n-type GaN semiconductor layers, respectively.

Referring to FIG. 6, in the case of the n-type electrode implemented by using $LaNi_5$, a forward voltage of the n-type electrode is about 3.45 V, which is lower than a forward voltage of about 3.77 V of the Ti/Al n-type electrode and a forward voltage of about 3.72 V of the Cr n-type electrode. Thus, it can be seen that the forward voltage characteristic of the La—Ni n-type electrode is better than that of a related art n-type electrode such as the Ti/Al n-type electrode and the Cr n-type electrode.

In the semiconductor light emitting device according to the embodiments of the present invention, an ohmic characteristic of the n-type electrode is improved to improve a forward-voltage characteristic and lower a turn-on voltage. Accordingly, characteristics of the semiconductor light emitting device are improved.

Also, in the semiconductor light emitting device according to the embodiments of the present invention, an input voltage is lowered to increase a ratio of quantity of emitted light to the input voltage, so that light emission efficiency (1 m/w) of the semiconductor light emitting device can be improved. Since the input voltage is low, the semiconductor light emitting device can operate at a low operating voltage and thus reliability of the semiconductor light emitting device can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   an n-type GaN semiconductor layer;
   an active layer formed on a gallium face of the n-type GaN semiconductor layer;
   a p-type semiconductor layer formed on the active layer; and
   an n-type electrode formed on a nitrogen face of the n-type GaN semiconductor layer and comprising a lanthanum (La)-nickel (Ni) alloy.

2. The semiconductor light emitting device of claim 1, wherein the La—Ni alloy is $LaNi_5$.

3. A method of manufacturing a semiconductor light emitting device, the method comprising:
   forming an n-type GaN semiconductor layer on a substrate;
   forming an active layer on a gallium face of the n-type GaN semiconductor layer;
   forming a p-type semiconductor layer on the active layer;
   removing the substrate; and
   forming an n-type electrode on a nitrogen face of the n-type GaN semiconductor layer, the n-type electrode including a lanthanum (La)-nickel (Ni) alloy.

4. The method of claim 3, wherein the La—Ni alloy is $LaNi_5$.

5. The method of claim 3, wherein the substrate is a sapphire substrate.

6. The method of claim 3, further comprising performing a laser treatment on the nitrogen face of the n-type GaN semiconductor layer before the forming of the n-type electrode.

7. A semiconductor light emitting device comprising:
   a GaN substrate;
   an n-type semiconductor layer formed on a gallium face of the GaN substrate;
   an active layer formed on the n-type semiconductor layer;
   a p-type semiconductor layer formed on the active layer; and
   an n-type electrode formed on a nitrogen face of the GaN substrate and comprising a lanthanum (La)-nickel (Ni) alloy.

8. The semiconductor light emitting device of claim 7, wherein the GaN substrate is a growth substrate or a support substrate.

9. The semiconductor light emitting device of claim 7, wherein the La—Ni alloy is $LaNi_5$.

10. A method of manufacturing a semiconductor light emitting device, the method comprising:
    forming an n-type semiconductor layer on a gallium face of a GaN substrate;
    forming an active layer on the n-type semiconductor layer;
    forming a p-type semiconductor layer on the active layer; and
    forming an n-type electrode on a nitrogen face of the GaN substrate, the n-type electrode including a lanthanum (La)-nickel (Ni) alloy.

11. The method of claim 10, wherein the La—Ni alloy is $LaNi_5$.

12. The method of claim 10, further comprising performing a laser treatment on the nitrogen face of the GaN substrate before the forming of the n-type electrode.

* * * * *